(12) United States Patent
Behzad et al.

(10) Patent No.: US 8,219,032 B2
(45) Date of Patent: Jul. 10, 2012

(54) METHOD AND SYSTEM FOR COMPENSATING FOR ESTIMATED DISTORTION IN A TRANSMITTER BY UTILIZING A DIGITAL PREDISTORTION SCHEME WITH A QUADRATURE FEEDBACK MIXER CONFIGURATION

(75) Inventors: Arya Behzad, Poway, CA (US); Ali Afsahi, San Diego, CA (US); Vikram Magoon, San Diego, CA (US); Mark Gonikberg, Los Altos Hills, CA (US); George Varghese, Karnataka (IN); Guruprasad Revanna, Karnataka (IN)

(73) Assignee: Broadcom Corporation, Irvine, CA (US)

( * ) Notice: Subject to any disclaimer, the term of this patent is extended or adjusted under 35 U.S.C. 154(b) by 599 days.

(21) Appl. No.: 11/618,876

(22) Filed: Dec. 31, 2006

(65) Prior Publication Data
US 2008/0137770 A1   Jun. 12, 2008

Related U.S. Application Data

(60) Provisional application No. 60/868,818, filed on Dec. 6, 2006.

(51) Int. Cl.
*H04B 1/00* (2006.01)
(52) U.S. Cl. ...................................... 455/63.1

(58) Field of Classification Search ............. 455/63.1, 455/114.3; 375/296, 285
See application file for complete search history.

(56) References Cited

U.S. PATENT DOCUMENTS

| | | | | |
|---|---|---|---|---|
| 5,125,100 | A * | 6/1992 | Katznelson | 725/143 |
| 6,680,648 | B2 * | 1/2004 | Nguyen et al. | 330/149 |
| 6,980,604 | B2 * | 12/2005 | Kubo et al. | 375/296 |
| 2004/0203458 | A1 * | 10/2004 | Nigra | 455/67.13 |

* cited by examiner

*Primary Examiner* — Temesgh Ghebretinsae
*Assistant Examiner* — David Bilodeau
(74) *Attorney, Agent, or Firm* — Thomas, Kayden, Horstemeyer & Risley LLP.

(57) ABSTRACT

Aspects of a method and system for compensating for estimated distortion in a transmitter by utilizing a digital predistortion scheme with a quadrature feedback mixer configuration are presented. Aspects of the system may include an RF transmitter that enables generation of an RF output signal in response to one or more generated input signals. One or more feedback signals may be generated by performing frequency downconversion on the RF output signal within a corresponding one or more feedback mixer circuits. The generated one or more feedback signals may be inserted at a corresponding one or more insertion points in an RF receiver. Each insertion point may be between a receiver mixer circuit and corresponding circuits that generate a baseband signal based on the corresponding one of the feedback signals.

29 Claims, 6 Drawing Sheets

METHOD AND SYSTEM FOR COMPENSATING FOR ESTIMATED DISTORTION IN A TRANSMITTER BY UTILIZING A DIGITAL PREDISTORTION SCHEME WITH A QUADRATURE FEEDBACK MIXER CONFIGURATION

CROSS-REFERENCE TO RELATED APPLICATIONS/INCORPORATION BY REFERENCE

This application makes reference to, claims priority to, and claims the benefit of U.S. Provisional Application Ser. No. 60/868,818, filed on Dec. 6, 2006.

The above stated application is hereby incorporated herein by reference in its entirety.

FIELD OF THE INVENTION

Certain embodiments of the invention relate to wireless communications. More specifically, certain embodiments of the invention relate to a method and system for compensating for estimated distortion in a transmitter by utilizing a digital predistortion scheme with a quadrature feedback mixer configuration.

BACKGROUND OF THE INVENTION

A power amplification circuit in a wireless system is typically a large signal device. In wireless local area network (WLAN) systems, the power amplifier circuit may transmit output signals at average power levels in the range of 10 dBm to 15 dBm, and peak power levels of about 25 dBm, for example. In WLAN systems, which use OFDM or CCK modulation, output power levels may vary widely such that the ratio of the peak power level to the average power level may be large, for example, 12 dB for OFDM and 6 dB for CCK. Because of these large swings in output power levels, power amplifier (PA) circuits may distort the output signal. Distortion, however, is a characteristic, which may be observed in PA circuits that are utilized across a wide range of applications, and may not be limited to PA circuits utilized in wireless systems. There are two metrics, which may be utilized to evaluate the distortion performance of PA circuits. These metrics may be referred to as amplitude modulation to amplitude modulation (AM-AM) distortion, and amplitude modulation to phase modulation (AM-PM) distortion.

The AM-AM distortion provides a measure of the output power level, $p_{out}$, in response to the input power level, $p_{in}$. The input power level, and output power level are each typically measured in units of dBm, for example. In an ideal, non-distorting, PA circuit, the output power level changes linearly in response to a change in the input power level. Thus, for each $\Delta p_{in}$ change in the input power level there may be a corresponding change in the output power level $\Delta p_{out}$. The AM-AM distortion may be observed when, for example, the output power level in response to a first input power level may be $p_{out1} \approx \alpha p_{in1}$, where the output level in response to a second input power level may be $p_{out2} \approx \beta p_{in2}$, when $\alpha \neq \beta$.

The AM-PM distortion provides a measure of the phase of the output signal in relation to the input signal (or output phase) in response to the input power level. Output phase is typically measured in units of angular degrees. The AM-PM distortion may be observed when, for example, the output phase changes in response to a change in input power level.

Limitations in the performance of PA circuitry due to distortion may be exacerbated when the PA is integrated in a single integrated circuit (IC) device with other radio frequency (RF) transmitter circuitry [such as digital to analog converters (DAC), low pass filters (LPF), mixers, and RF programmable gain amplifiers (RFPGA)]. Whereas the pressing need to increase the integration of functions performed within a single IC, and attendant increase in the number of semiconductor devices, may push semiconductor fabrication technologies toward increasingly shrinking semiconductor device geometries, these very semiconductor fabrication technologies may impose limitations on the performance of the integrated PA circuitry. For example, utilizing a 65 nm CMOS process may restrict the range of input power levels for which the PA provides linear output power level amplification.

The AM-AM distortion and/or the AM-PM distortion comprise transmitter impairments that may result in signal transmission errors that may result in unintentional and/or undesirable modifications in the magnitude and/or phase of transmitted signals. When transmitting quadrature RF signals, the AM-AM distortion and/or the AM-PM distortion may cause unintentional and/or undesirable modifications in the magnitude and/or phase of the I components and/or Q components in the transmitted signals.

The transmission of erroneous signals from an RF transmitter may result in erroneous detection of data contained within the received signals at an RF receiver. The result may be reduced communications quality as measured, for example, by packet error rate (PER), and/or bit error rate (BER).

Communications standards may specify a limit for Error Vector Magnitude (EVM) in a transmitted signal. For example, IEEE 802.11g standard for WLAN communications specifies that $EVM_{dB}$ for a 54 Mbps transmitted signal may be no greater than −25 dB. Thus, some conventional RF transmitters may be required to limit the peak power level for signals generated by the PA to ensure that the transmitted signals comply with EVM specifications. One potential limitation imposed by the reduced output power level is the reduced operating range in wireless communications. In this regard, the EVM specification may reduce the allowable distance between a transmitting antenna and a receiving antenna for which signals may be transmitted from an RF transmitter and received by an RF receiver, in relation to the operating range that would be theoretically possible if the RF transmitter were able to transmit signals at the maximum, or saturation, output power level that could be generated by the PA.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A method and system for compensating for estimated distortion in a transmitter by utilizing a digital predistortion scheme with a quadrature feedback mixer configuration, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for compensating for estimated distortion in a transmitter by utilizing a digital predistortion scheme with a quadrature feedback mixer configuration. Various embodiments of the invention may comprise a system in which an input signal is generated by a baseband processor and communicated to an RF transmitter chain. The output from a PA circuit in the RF transmitter chain may be attenuated and downconverted into individual I and Q signals by utilizing a quadrature feedback mixer configuration. The downconverted I and Q signals may then be respectively inserted as feedback signals in the I and Q paths in the RF receiver chain. By selecting a range of input power levels, the baseband processor may measure corresponding output power levels and output phase measurements.

Based on these measurements, the baseband processor may estimate the AM-AM distortion, and/or AM-PM distortion, performance of the PA circuit. Separate measurements may be derived for the individual I and Q signals. Also based on these measurements, the baseband processor may generate subsequent input signals, wherein the input power levels and/or input phase may be adjusted, or predistorted, to compensate for the estimated AM-AM distortion, and/or AM-PM distortion. The predistortion may be applied to a digital signal, and thereby may be referred to as a digital predistortion scheme. The amount of predistortion may be determined individually for the I and Q signals. Various embodiments of the invention may also enable compensation for the AM-AM and/or the AM-PM distortion in PA circuits, which may result from semiconductor fabrication technologies, such as 65 nm CMOS processes, for example.

Figure 1:
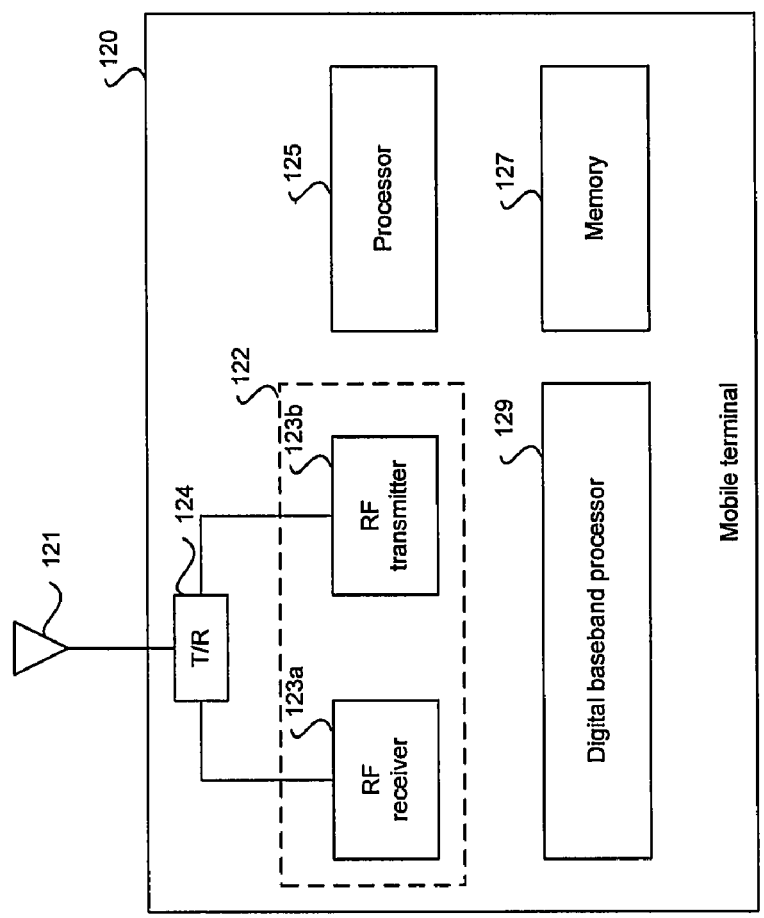
FIG. 1 is a block diagram illustrating and exemplary mobile terminal, which may be utilized in connection with an embodiment of the invention.

FIG. 1 is a block diagram illustrating and exemplary mobile terminal, which may be utilized in connection with an embodiment of the invention. Referring to FIG. 1, there is shown a mobile terminal 120 that may comprise an RF receiver 123a, an RF transmitter 123b, a digital baseband processor 129, a processor 125, and a memory 127. In some embodiments of the invention, the RF receiver 123a, and RF transmitter 123b may be integrated into an RF transceiver 122, for example. A single transmit and receive antenna 121 may be communicatively coupled to the RF receiver 123a and the RF transmitter 123b. A switch 124, or other device having switching capabilities may be coupled between the RF receiver 123a and RF transmitter 123b, and may be utilized to switch the antenna 121 between transmit and receive functions.

The RF receiver 123a may comprise suitable logic, circuitry, and/or code that may enable processing of received RF signals. The RF receiver 123a may enable receiving RF signals in frequency bands utilized by various wireless communication systems, such as WLAN, Bluetooth, GSM and/or CDMA, for example.

The digital baseband processor 129 may comprise suitable logic, circuitry, and/or code that may enable processing and/or handling of baseband signals. In this regard, the digital baseband processor 129 may process or handle signals received from the RF receiver 123a and/or signals to be transferred to the RF transmitter 123b for transmission via a wireless communication medium. The digital baseband processor 129 may also provide control and/or feedback information to the RF receiver 123a and to the RF transmitter 123b, based on information from the processed signals. The digital baseband processor 129 may communicate information and/or data from the processed signals to the processor 125 and/or to the memory 127. Moreover, the digital baseband processor 129 may receive information from the processor 125 and/or to the memory 127, which may be processed and transferred to the RF transmitter 123b for transmission via the wireless communication medium.

The RF transmitter 123b may comprise suitable logic, circuitry, and/or code that may enable processing of RF signals for transmission. The RF transmitter 123b may enable transmission of RF signals in frequency bands utilized by various wireless communications systems, such as GSM and/or CDMA, for example.

The processor 125 may comprise suitable logic, circuitry, and/or code that may enable control and/or data processing operations for the mobile terminal 120. The processor 125 may be utilized to control at least a portion of the RF receiver 123a, the RF transmitter 123b, the digital baseband processor 129, and/or the memory 127. In this regard, the processor 125 may generate at least one signal for controlling operations within the mobile terminal 120.

The memory 127 may comprise suitable logic, circuitry, and/or code that may enable storage of data and/or other information utilized by the mobile terminal 120. For example, the memory 127 may be utilized for storing processed data generated by the digital baseband processor 129 and/or the processor 125. The memory 127 may also be utilized to store information, such as configuration information, which may be utilized to control the operation of at least one block in the mobile terminal 120. For example, the memory 127 may comprise information necessary to configure the RF receiver 123a to enable receiving RF signals in the appropriate frequency band.

Figure 2A:
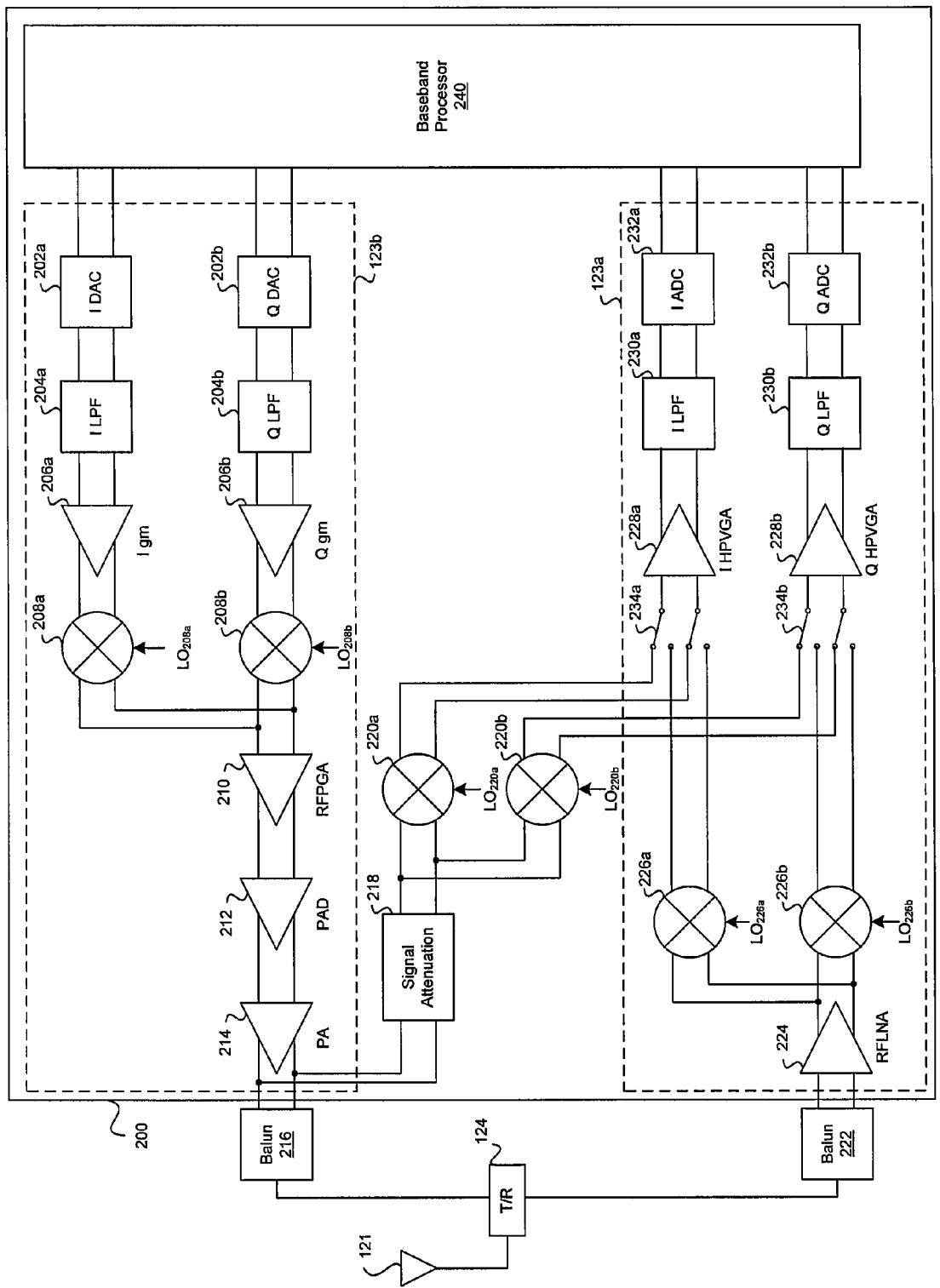
FIG. 2A is an exemplary block diagram illustrating a single chip RF transmitter and receiver utilizing a quadrature feedback mixer configuration, in accordance with an embodiment of the invention.

FIG. 2A is an exemplary block diagram illustrating a single chip RF transmitter and receiver utilizing a quadrature feedback mixer configuration, in accordance with an embodiment of the invention. Referring to FIG. 2A, there is shown a single chip RF transceiver 200, baluns 216 and 222, switch 124, and antenna 121. The single chip RF transceiver 200 may comprise the RF receiver 123a, the RF transmitter 123b, a signal attenuation block 218, a feedback I mixer 220a, a feedback Q mixer 220b, and a baseband processor 240. The RF transmitter 123b may comprise a power amplifier (PA) 214, a power amplifier driver (PAD) 212, an RF programmable gain amplifier (RFPGA) 210, a transmitter In-phase signal (I) mixer 208a, a transmitter Quadrature-phase signal (Q) mixer 208b, an I transconductance amplifier (gm) 206a, a Q gm 206b, an I low pass filter (LPF) 204a, a Q LPF 204b, an I diqital-to-analog converter (I DAC) 202a, and a Q DAC 202b. The RF receiver 123a may comprise an RF low noise amplifier (RFLNA) 224, a receiver I mixer 226a, a receiver Q mixer 226b, an I path selector switch 234a, a Q path selector switch 234b, an I high pass variable gain amplifier (HPVGA) 228a, a Q HPVGA 228b, an I LPF 230a, a Q LPF 230b, an I analog-to-digital converter (DAC) 232a, and a Q DAC 232b.

The signal attenuation block 218 may comprise suitable logic, circuitry, and/or code that may enable generation of an output signal, the amplitude and/or power level of which may be based on an input signal after insertion of a specified level of attenuation. In various embodiments of the invention the attenuation level may be programmable over a range of attenuation levels. In an exemplary embodiment of the invention, the range of attenuation levels may comprise −32 dB to −40 dB, although various embodiments of the invention may not be limited to such a specific range. In an exemplary embodiment of the invention, the signal attenuation block 218 may receive a differential input signal and output a differential output signal.

The feedback I mixer 220a may comprise suitable logic, circuitry, and/or code that may enable downconversion of an input signal. The feedback I mixer 220a may utilize an input local oscillator signal labeled as $LO_{220a}$ (in FIG. 2A) to downconvert the input signal. The input signal may be an upconverted quadrature RF signal. In an exemplary embodiment of the invention, the feedback I mixer 220a may receive a differential input signal and output a differential output signal.

The feedback Q mixer 220b may be substantially similar to the feedback I mixer 220a. The feedback Q mixer 220b may utilize an input local oscillator signal labeled $LO_{220b}$ (in FIG. 2A) to downconvert the input signal.

The PA 214 may comprise suitable logic, circuitry, and/or code that may enable amplification of input signals to generate a transmitted signal of sufficient signal power (as measured by dBm, for example) for transmission via a wireless communication medium. In an exemplary embodiment of the invention, the PA 214 may receive a differential input signal and output a differential output signal.

The PAD 212 may comprise suitable logic, circuitry, and/or code that may enable amplification of input signals to generate an amplified output signal. The PAD 212 may be utilized in multistage amplifier systems wherein the output of the PAD 212 may be an input to a subsequent amplification stage. In an exemplary embodiment of the invention, the PAD 212 may receive a differential input signal and output a differential output signal.

The RFPGA 210 may comprise suitable logic, circuitry, and/or code that may enable amplification of input signals to generate an amplified output signal, wherein the amount of amplification, as measured in dB, may be determined based on an input control signal. In various embodiments of the invention, the input control signal may comprise binary bits. In an exemplary embodiment of the invention, the RFPGA 210 may receive a differential input signal and generate a differential output signal.

The transmitter I mixer 208a may comprise suitable logic, circuitry, and/or code that may enable generation of an RF signal by upconversion of an input signal. The transmitter I mixer 208a may utilize an input local oscillator signal labeled as $LO_{208a}$ to upconvert the input signal. The upconverted signal may be an RF signal. The transmitter I mixer 208a may produce an RF signal for which the carrier frequency may be equal to the frequency of the signal $LO_{208a}$. In an exemplary embodiment of the invention, the transmitter I mixer 208a may receive a differential input signal and generate a differential output signal.

The transmitter Q mixer 208b may be substantially similar to the transmitter I mixer 208a. The transmitter Q mixer 208b may utilize an input local oscillator signal labeled as $LO_{208b}$ in quadrature to $LO_{208a}$ (in FIG. 2A) to upconvert the input signal.

The I gm 206a may comprise suitable, logic, circuitry, and/or code that may enable generation of an output current, the amplitude of which may be proportional to an amplitude of an input voltage, wherein the measure of proportionality may be determined based on the transconductance parameter, $gm_I$, associated with the I gm 206a. In an exemplary embodiment of the invention, the I gm 206a may receive a differential input signal and output a differential output signal.

The Q gm 206b may be substantially similar to the I gm 206a. The transconductance parameter associated with the Q gm 206b is $gm_Q$.

The I LPF 204a may comprise suitable logic, circuitry, and/or code that may enable selection of a cutoff frequency, wherein the LPF may attenuate the amplitudes of input signal components for which the corresponding frequency is higher than the cutoff frequency, while the amplitudes of input signal components for which the corresponding frequency is less than the cutoff frequency may "pass," or not be attenuated, or attenuated to a lesser degree than input signal components at frequencies higher than the cutoff frequency. In various embodiments of the invention, the I LPF 210a may be implemented as a passive filter, such as one that utilizes resistor, capacitor, and/or inductor elements, or implemented as an active filter, such as one that utilizes an operational amplifier. In an exemplary embodiment of the invention, the I LPF 210a may receive a differential input signal and output a differential output signal.

The Q LPF 204b may be substantially similar to the I LPF 204a.

The I DAC 202a may comprise suitable logic, circuitry, and/or code that may enable conversion of an input digital signal to a corresponding analog representation.

The Q DAC 202b may be substantially similar to the I DAC 202a.

The RFLNA 224 may comprise suitable logic, circuitry, and/or code that may enable amplification of weak signals (as measured by dBm, for example), such as received from an antenna. The input signal may be an RF signal received at an antenna, which is communicatively coupled to the RFLNA 224. The RFLNA 224 may typically be located in close physical proximity to the antenna to avoid further weakening of the signal received at the antenna. In an exemplary embodiment of the invention, the RFLNA 224 may receive a differential input signal and output a differential output signal.

The receiver I mixer 226a may be substantially similar to the feedback I mixer 220a. The receiver I mixer 226a may utilize an input local oscillator signal labeled as $LO_{226a}$ (in FIG. 2A) to downconvert the input signal.

The receiver Q mixer 226b may be substantially similar to the feedback Q mixer 220b. The receiver Q mixer 226b may utilize an input local oscillator signal labeled as $LO_{226b}$ (in FIG. 2A) to downconvert the input signal.

The I path selector switch 234a may comprise suitable logic, circuitry, and/or code that may enable an input signal to be selectively coupled to one of a plurality of output points. In an exemplary embodiment of the invention, the I path selector switch 234a may select from 2 pairs of differential input signals, coupling the selected differential input signal to a differential output.

The Q path selector switch 234b may be substantially similar to the I path selector switch 234a.

The I HPVGA 228a may comprise suitable logic, circuitry, and/or code that may enable attenuation of input signals to generate an attenuated output signal, wherein the amount of attenuation, as measured in dB for example, may be determined based on an input control signal. In various embodiments of the invention, the input control signal may comprise binary bits. In various embodiments of the invention, the HPVGA 228a may provide attenuation levels that range from 0 dB to −30 dB in 3 dB increments. In an exemplary embodiment of the invention, the I HPVGA 228a may receive a differential input signal and output a differential output signal.

The I LPF 230a and Q LPF 230b may be substantially similar to the I LPF 204a.

The I ADC 232a may comprise suitable logic, circuitry, and/or code that may enable conversion of an input analog signal to a corresponding digital representation. The I ADC 232a may receive an input analog signal, which may be characterized by a signal amplitude.

The I ADC 232a may quantize the analog signal by correlating ranges of analog signal level values to corresponding numerical values. The I ADC 232a may determine analog signal levels at distinct time instants by measuring, or integrating, the analog signal level of the input signal during a time interval referred to as δt. The time interval between measurements, or sampling interval, may be determined based on a sampling rate, which is typically long in comparison to the integration time interval δt. In an exemplary embodiment of the invention, the I ADC 232a may receive a differential input signal and output a differential output signal.

The Q ADC 232b may be substantially similar to the I ADC 232a.

The baseband processor 240 may comprise suitable logic, circuitry, and/or code that may enable processing of binary data contained within an input baseband signal. The baseband processor 240 may perform processing tasks, which correspond to one or more layers in an applicable protocol reference model (PRM). For example, the baseband processor 240 may perform physical (PHY) layer processing, layer 1 (L1) processing, medium access control (MAC) layer processing, logical link control (LLC) layer processing, layer 2 (L2) processing, and/or higher layer protocol processing based on input binary data. The processing tasks performed by the baseband processor 240 may be referred to as being within the digital domain. The baseband processor 240 may also generate control signals based on the processing of the input binary data. In an exemplary embodiment of the invention, the baseband processor 240 may receive differential input signals and output differential output signals.

In operation, the baseband processor 240 may generate data comprising a sequence of bits to be transmitted via a wireless communications medium. The baseband processor 240 may generate control signals that configure the RF transmitter 123b to transmit the data. The baseband processor 240 may send a portion of the data, an $I_{BB}$ signal, to the I DAC 202a, and another portion of the data, a $Q_{BB}$ signal, to the Q DAC 202b. The I DAC 202a may receive a sequence of bits and generate an analog signal. The Q DAC 202b may similarly generate an analog signal.

The analog signals generated by the I DAC 202a and Q DAC 202b may comprise undesirable frequency components. The I LPF 204a and Q LPF 204b may attenuate signal amplitudes associated with these undesirable frequency components in signals generated by the I DAC 202a and Q DAC 202b respectively. The baseband processor 240 may configure the transmitter I mixer 208a to select a frequency for the $LO_{208a}$ signal utilized to upconvert the filtered signal from the I LPF 204a. The upconverted signal output from the transmitter I mixer 208a may comprise an I component RF signal. The baseband processor 240 may similarly configure the transmitter Q mixer 208b to generate a Q component RF signal from the filtered signal from the Q LPF 204b.

The RFPGA 210 may amplify the I component and Q component RF signals to generate a quadrature RF signal, wherein the level of amplification provided by the RFPGA 210 may be configured based on control signals generated by the baseband processor 240. The PAD 212 may provide a second stage of amplification for the signal generated by the RFPGA 210, and the PA 214 may provide a third stage of amplification for the signal generated by the PAD 212. The amplified signal from the PA 214 may be transmitted to the wireless communications medium via the antenna 121.

The baseband processor 240 may configure the RF receiver 123a and/or RF transmitter 123b for two modes of operation comprising a normal operating mode, and a calibration mode. In the normal operating mode, the RF transmitter 123b may transmit RF signals via the antenna 121, while the RF receiver 123a may receive RF signals via the antenna 121. In the calibration mode, the RF signal output from the RF transmitter 123b may be attenuated, downconverted into I and Q component signals, and inserted in the RF receiver 123a as feedback signals. Thus, the calibration mode may enable a closed feedback loop from the baseband processor 240, to the RF transmitter 123b, to a feedback point within the RF receiver 123a, and back to the baseband processor 240.

In a normal operating mode, the baseband processor 240 may generate control signals that enable configuration of the I path selector switch 234a such that I path selector switch 234a may be configured to select an input from the receiver I mixer 226a. The I path selector switch 234a may enable the output signal from the receiver I mixer 226a to be coupled to an input to the I HPVGA 228a. The baseband processor 240 may also generate control signals that enable configuration of the Q path selector switch 234b such that Q path selector switch 234b may be configured to select an input from the receiver Q mixer 226b. The Q path selector switch 234b may enable the output signal from the receiver Q mixer 226b to be coupled to an input to the Q HPVGA 228b.

In the normal operating mode, the RF receiver 123a may receive RF signals via the antenna 121. The RFLNA 224 may amplify the received RF signal, which may then be sent to the receiver I mixer 226a and/or receiver Q mixer 226b. The receiver I mixer 226a may downconvert the amplified RF signal. Similarly, the receiver Q mixer 226b may also downconvert the amplified RF signal.

The baseband processor 240 may generate control signals that configure the I HPVGA 228a to amplify a portion of the downconverted signal $Output_{226a}$. In an exemplary embodiment of the invention, the I HPVGA 228a may amplify signal components for which the corresponding frequency may be higher than baseband. Similarly, the baseband processor 240 may generate control signals that configure the Q HPVGA 228b to attenuate a portion of the downconverted signal $Output_{226b}$.

The I LPF 230a may filter the amplified signal received from the I HPVGA 228a such that the output of the I LPF 230a is a baseband signal. The baseband signal may comprise a sequence of symbols. Similarly, the Q LPF 230b may generate a baseband signal. The I ADC 232a may convert an amplitude of a symbol in the baseband signal received from the I LPF 230a to a sequence of bits. Similarly, the Q ADC 232b may convert an amplitude of a symbol in the baseband signal received from the Q LPF 230b to a sequence of bits. The baseband processor 240 may receive the sequence of bits from the I ADC 232a and Q ADC 232b and perform various processing tasks as set forth above.

In the calibration mode, the baseband processor 240 may generate control signals that enable configuration of the I path selector switch 234a to select an input from the feedback I mixer 220a. The I path selector switch 234a may enable the output signal from the feedback I mixer 220a to be coupled to an input to the I HPVGA 228a. The baseband processor 240 may also generate control signals that enable configuration of the Q path selector switch 234b to select an input from the feedback Q mixer 220b. The Q path selector switch 234b may enable the output signal from the feedback Q mixer 220b to be coupled to an input to the Q HPVGA 228b. In the exemplary block diagram shown in FIG. 2A, the I path selector switch 234a may be configured to couple an output signal from the feedback I mixer 220a to an input to the I HPVGA 228a, and the Q path selector switch 234b may be configured to couple an output signal from the feedback Q mixer 220b to an input to the Q HPVGA 228b.

In the calibration mode, the output signal from the PA 214 may be input to the signal attenuation block 218. In the calibration mode, the baseband signals are unmodulated. The signal attenuation block 218 may adjust the amplitude of the RF signal generated by the PA 214 to a level more suitable for input to the feedback mixers 220a and 220b. The signal attenuation block 218 may be configured by the baseband processor 240 to apply a specified attenuation level to the input signal from the PA 214. The feedback I mixer 220a may downconvert an attenuated RF signal to generate an $Output_{220a}$ signal. The feedback Q mixer 220b may downconvert an attenuated RF signal to generate an $Output_{220b}$ signal. In the calibration mode, the I HPVGA 228a may receive input signals from the feedback I mixer 220a, while the Q HPVGA 228b may receive input signals from the feedback Q mixer 220b.

The I LPF 230a may filter the amplified signal received from the I HPVGA 228a such that the output of the I LPF 230a may be based on the baseband component of the $Output_{220a}$ signal. Similarly, the Q LPF 230b may generate a baseband signal.

One limitation of the PA 214 is that the output signal may become increasingly distorted as the output power level from the PA 214 increases. The distortion may be detected through AM-AM distortion measurements, and/or AM-PM distortion measurements.

In various embodiments of the invention, the calibration mode may enable the baseband processor 240 to compensate for AM-AM distortion and/or AM-PM distortion. In one aspect of the invention, the calibration mode may enable the baseband processor 240 to send input signals $I_{BB}$ and $Q_{BB}$ to the RF transmitter 123b, from which a quadrature RF signal may be generated as an output signal from the PA 214. The output signal from the PA 214 to be attenuated by the signal attenuation block 218, downconverted by the feedback I mixer 220a and the feedback Q mixer 220b. The downconverted signal generated by the feedback I mixer 220a may comprise an I signal component derived from the quadrature RF signal generated by the PA 214, while the downconverted signal generated by the feedback Q mixer 220b may comprise a Q signal component. The downconverted signal from the feedback I mixer 220a may be inserted into the RF receiver 123a path as a feedback signal, $I_F$, input to the I HPVGA 228a, while the downconverted signal from the feedback Q mixer 220b may be inserted into the RF receiver 123a path as a feedback signal, $Q_F$, input to the Q HPVGA 228b. The feedback signals, $I_F$ and $Q_F$, may be processed within the RF receiver 123a path and received as baseband signals, $I_{FB}$ and/or $Q_{FB}$ respectively, at the baseband processor 240.

The baseband processor 240 may then estimate the AM-AM distortion performance of the PA 214 based on the amplitudes of the $I_{FB}$ and/or $Q_{FB}$ signals, and the amplitudes of the $I_{BB}$ and $Q_{BB}$. The baseband processor 240 may estimate the AM-PM distortion performance of the PA 214 based on the relative phase of the $I_{FB}$ and the $I_{BB}$ signals, and/or the relative phase of the $Q_{FB}$ and $Q_{BB}$ the signals. By estimating the AM-AM distortion performance and/or AM-PM distortion performance of the PA 214 for a range of input power levels for the $I_{BB}$ and $Q_{BB}$ signals, the baseband processor 240 may compute a characterization of the AM-AM performance and/or AM-PM performance of the PA 214 for a range of input power levels and/or output power levels.

In various embodiments of the invention, the baseband processor may individually estimate AM-AM distortion performance of the PA 214 for I component signals in a quadrature RF output signal, and separately for Q component signals in a quadrature RF output signal. Thus, an I component AM-AM distortion performance of the PA 214 may be estimated based on the amplitude of the $I_{FB}$ signal, and the amplitude of the $I_{BB}$ signal, while an I component relative phase may be estimated based on the relative phase of the $I_{FB}$ and $I_{BB}$ signals. Similarly, a Q component AM-AM distortion performance of the PA 214 may be estimated based on the amplitude of the $Q_{FB}$ signal, and the amplitude of the $Q_{BB}$ signal, while a Q component relative phase may be estimated based on the relative phase of the $Q_{FB}$ and $Q_{BB}$ signals.

After characterizing the AM-AM distortion performance, and/or AM-PM distortion performance of the PA 214, the baseband processor 240 operating in the normal mode may determine an intended output power level, $p_{out\_ideal}$, and/or relative phase, $\phi_{ideal}$, for an output generated by the PA 214 based on original power level, $p_{in}$, for the input signals $I_{BB}$ and/or $Q_{BB}$, respectively. The intended output power level and/or relative phase may be based on an ideal PA, which may be linear across the range of input power levels and/or output power levels. The baseband processor 240 may adjust the original power level and/or relative phase for the input signals $I_{BB}$ and/or $Q_{BB}$ to select adjusted input power level $adj\_p_{in}$ and/or $adj\_\phi_{in}$ that produce the intended output power level $p_{out\_ideal}$ and/or relative phase $\phi_{ideal}$ based on the characterization.

The adjustments to the power levels and/or phase adjustments for the input signals may be referred to as distortion of the digital signals, $I_{BB}$ and/or $Q_{BB}$, which may provide compensation for estimated AM-AM and/or AM-PM distortion of signals in the PA 214. These compensatory adjustments on the digital signals may, therefore, be referred to as a digital predistortion scheme, which may be practiced in various embodiments of the invention. In various embodiments of the invention, the digital predistortion scheme may enable a method and system for compensating for estimated distortion from a PA 214 resulting from limitations imposed by various semiconductor fabrication technologies, for example 65 nm CMOS. Various embodiments of the invention may provide a method and system for compensating for estimated distortion from a PA 214 integrated into an RF transmitter 123b on a single IC 200.

In various embodiments of the invention, the selected semiconductor fabrication technology, for example 65 nm CMOS, may enable integration of the PA 214 with an RF transmitter 123b in a single IC 200. In turn, the integration of the PA 214 within an RF transmitter 123b, which is integrated in the same IC 200 with the signal attenuation block 218, feedback I mixer 220a, feedback Q mixer 220b, and RF receiver 123a, may enable a means by which the signal attenuation block 218 may receive differential input signals from the PA 214, and adjust the level of attenuation of the input signal at the signal attenuation block 218 under control of the baseband processor 240.

In various embodiments of the invention, the feedback signal from the PA 214 utilizes at least a portion of the circuitry in the RF receiver 123a to send the feedback signals $I_{FB}$ and/or $Q_{FB}$ to the baseband processor 240. The approach differs from an approach in which the feedback path from the PA 214 to the baseband processor 240 utilizes dedicated circuitry. By reusing circuitry in the RF receiver path 123a, the amount of circuitry required to implement the feedback loop may be reduced, which may consequently reduce IC manufacturing cost, and operating temperature, and/or improve IC reliability and/or performance.

In various embodiments of the invention, the feedback signal sent from the PA 214 to the feedback I mixer 220a, and/or feedback Q mixer 220b, may be based on a signal comprising data transmitted from the RF transmitter 123b, for example OFDM symbols generated by the baseband processor 240 and transmitted in a WLAN network. In this case, calibration may be performed concurrently while the RF transmitter 123b is transmitting data. In other embodiments of the invention, the feedback signal may be based on a continuous wave signal, for example a sine wave signal generated by the baseband processor 240.

Figure 2B:
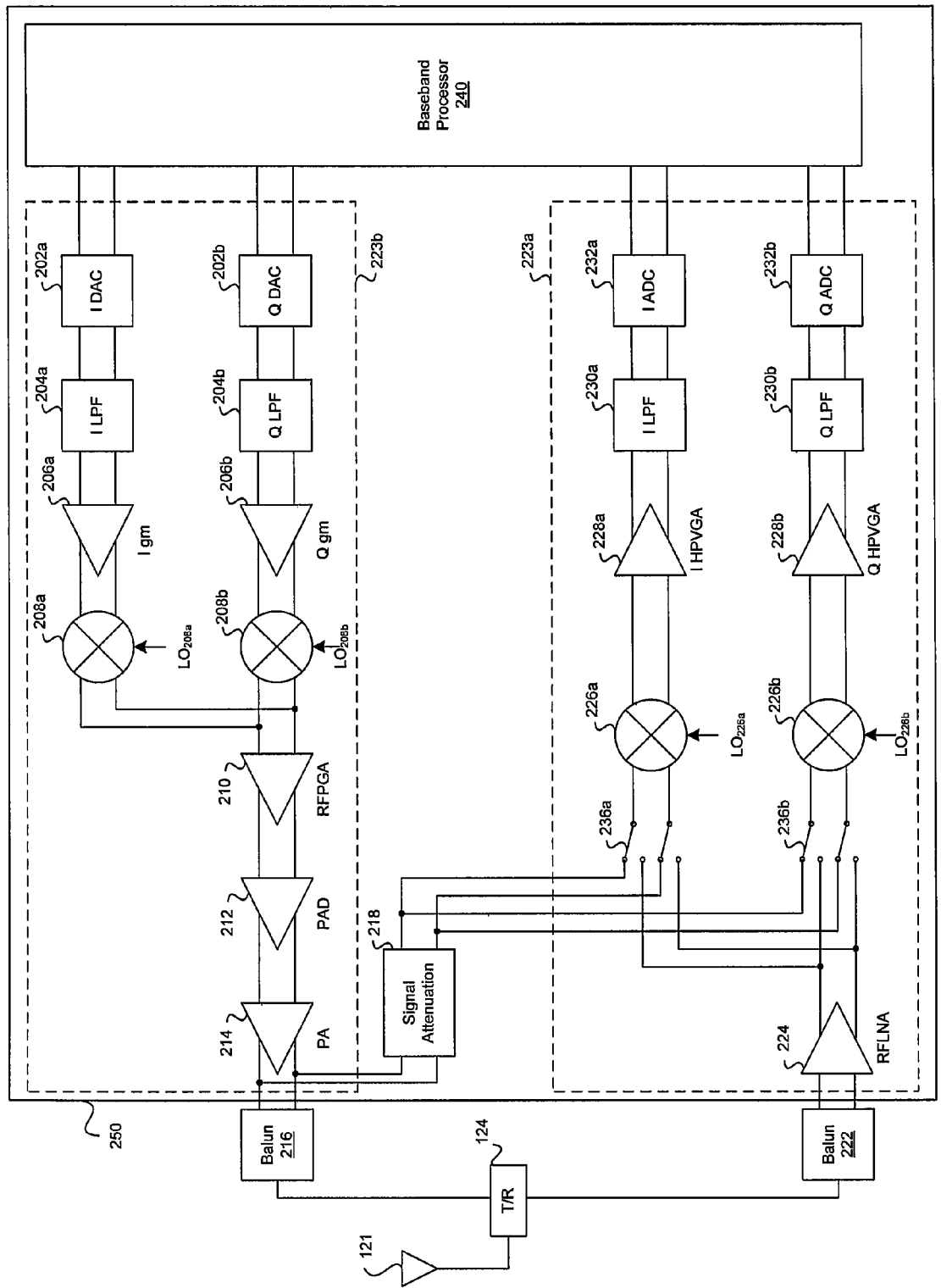
FIG. 2B is an exemplary block diagram illustrating a single chip RF transmitter and receiver utilizing quadrature feedback through the receiver mixer circuits, in accordance with an embodiment of the invention.

FIG. 2B is an exemplary block diagram illustrating a single chip RF transmitter and receiver utilizing quadrature feedback through the receiver mixer circuits, in accordance with an embodiment of the invention. Referring to FIG. 2B, there is shown a single chip RF transceiver 250, baluns 216 and 222, switch 124, and antenna 121. The single chip RF transceiver 250 may comprise an RF receiver 223a, an RF transmitter 223b, a signal attenuation block 218, and a baseband processor 240. The RF transmitter 223b may comprise a power amplifier (PA) 214, a power amplifier driver (PAD) 212, an RF programmable gain amplifier (RFPGA) 210, a transmitter In-phase signal (I) mixer 208a, a transmitter Quadrature-phase signal (Q) mixer 208b, an I transconductance amplifier (gm) 206a, a Q gm 206b, an I low pass filter (LPF) 204a, a Q LPF 204b, an I digital to analog converter (I DAC) 202a, and a Q DAC 202b. The RF receiver 223a may comprise an RF low noise amplifier (RFLNA) 224, a receiver I mixer 226a, a receiver Q mixer 226b, an I path selector switch 236a, a Q path selector switch 236b, an I high pass variable gain amplifier (HPVGA) 228a, a Q HPVGA 228b, an I LPF 230a, a Q LPF 230b, an I analog to digital converter (DAC) 232a, and a Q DAC 232b.

FIG. 2B differs from FIG. 2A in that the receiver I mixer 226a and receiver Q mixer 226b may be utilized to downconvert the feedback signal from the signal attenuation block 218. The I path selector switch 236a may be substantially similar to the I path selector switch 224a. The Q path selector switch 236b may be substantially similar to the Q path selector switch 224b.

In a normal operating mode, the baseband processor 240 may generate control signals that enable configuration of the I path selector switch 236a such that I path selector switch 236a may be configured to select an input from the RFLNA 224. The I path selector switch 234a may enable the output signal from the RFLNA 224 to be coupled to an input to the receiver I mixer 226a. The baseband processor 240 may also generate control signals that enable configuration of the Q path selector switch 236b such that Q path selector switch 236b may be configured to select an input from the RFLNA 224. The Q path selector switch 234b may enable the output signal from the RFLNA 224 to be coupled to an input to the receiver Q mixer 226b.

In a calibration mode, the baseband processor 240 may generate control signals that enable configuration of the I path selector switch 236a to select an input from the signal attenuation block 218. The I path selector switch 236a may enable the output signal from the signal attenuation block 218 to be coupled to an input to the receiver I mixer 226a. The baseband processor 240 may also generate control signals that enable configuration of the Q path selector switch 236b to select an input from the signal attenuation block 218. The Q path selector switch 236b may enable the output signal from the signal attenuation block 218 to be coupled to an input to the receiver Q mixer 226b. In the exemplary block diagram shown in FIG. 2B, the I path selector switch 236a may be configured to couple an output signal from the signal attenuation block 218 to an input to the receiver I mixer 226a, and the Q path selector switch 236b may be configured to couple an output signal from the signal attenuation block 218 to an input to the receiver Q mixer 226b.

Figure 3:
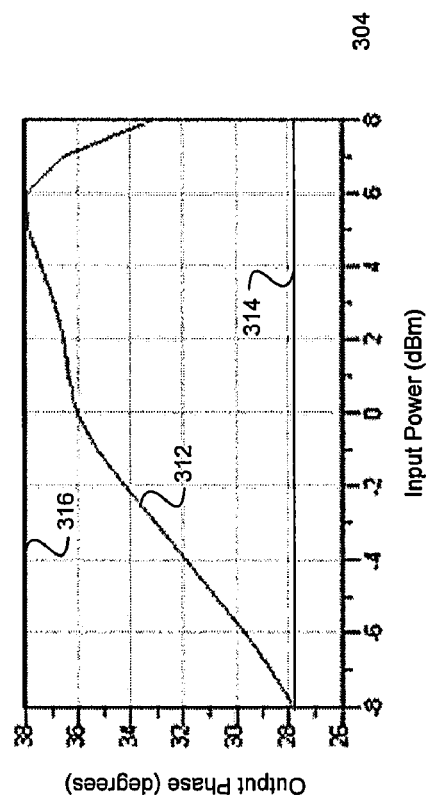
FIG. 3A is a graph illustrating an exemplary AM-AM distortion response in a transmitter power amplifier circuit, in accordance with an embodiment of the invention.
FIG. 3B is a graph illustrating an exemplary AM-PM distortion response in a transmitter power amplifier circuit, in accordance with an embodiment of the invention.
Figure 3:
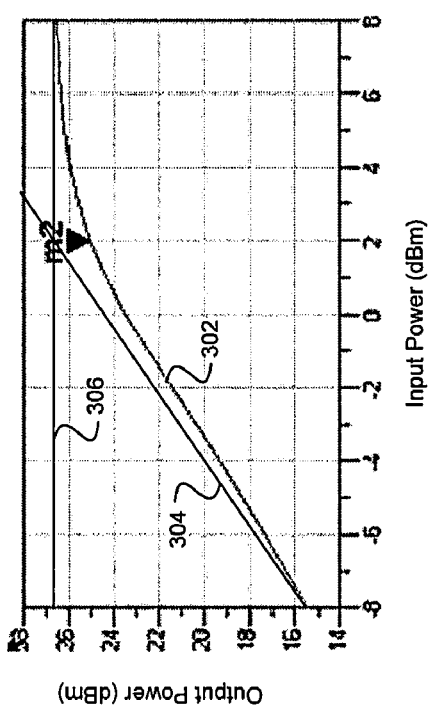

FIG. 3A is a graph illustrating an exemplary AM-AM distortion response in a transmitter power amplifier circuit, in accordance with an embodiment of the invention. Referring to FIG. 3A, there is shown an AM-AM distortion response curve 302, an ideal PA response curve 304, and an asymptotic output signal power level curve 306. In the exemplary graph shown in FIG. 3A, the horizontal axis represents input power levels, Pin, as measured in dBm. The input power level, Pin, may be measured at the outputs from the baseband processor 240 that are input to the I DAC 202a and/or Q DAC 202b. The vertical axis represents output power levels, Pout, as measured in dBm. The output power level, Pout, may be measured from the output from the PA 214.

In various embodiments of the invention, the AM-AM distortion response curve 302 may be derived by configuring the RF receiver 123a in the calibration mode and generating input signals from the baseband processor 240 that span a range of input power levels, while measuring the corresponding power levels in the feedback signal received at the baseband processor 240. The AM-AM distortion response curve 302 may comprise a characterization of the AM-AM distortion performance of the PA 214. In the exemplary graph shown in FIG. 3A, the input power level may range from −8 dBm, to 8 dBm, while the output power level may range from about 15.5 dBm to about 26.5 dBm.

For values of output power level in the range from about 15.5 dBm to about 16.5 dBm, the AM-AM distortion response curve 302 may be substantially linear, and the calibration measurements of the PA 214 output performance are approximately equal to the ideal PA response curve 304. Thus, AM-AM distortion may be low for this first range of output power levels.

For values of output power level in the range from about 16.5 dBm to about 21 dBm, the AM-AM distortion response curve 302 begins to diverge from the ideal PA response curve 304. Thus, AM-AM distortion in the PA 214 may increase for this second range of output power levels.

For values of output power level in the range from about 21 dBm to about 26.5 dBm, the AM-AM distortion response curve 302 begins to diverge from the ideal PA response curve 304 by an even greater amount. Within this output power level range, the AM-AM distortion response curve 302 begins to level off at a peak output power level, corresponding to the asymptotic output signal power curve 306. Thus, AM-AM distortion in the PA 214 may increase by an even greater amount for this third range of output power levels.

The baseband processor 240 may utilize the AM-AM distortion response curve 302 to digitally predistort power levels for input signals to compensate for the estimated AM-AM distortion in the PA 214 based on the AM-AM distortion response curve 302. For example, for an input power level of 0 dBm, the intended output power level may be about 24.5 dBm as shown in the ideal PA response curve 304. However, due to AM-AM distortion in the PA 214, the estimated output power level may be about 23.5 dBm as shown in the AM-AM distortion response curve 302.

In various embodiments of the invention, the baseband processor 240 may enable compensation for the estimated AM-AM distortion performance in the PA 214 by adjusting the input power level from 0 dBm to about 1 dBm. Based on the AM-AM distortion response curve 302, the output power level is about 24.5 dBm in response to an input power level of about 1 dBm. Thus, about 1 dBm of digital distortion may be applied to the input signals $I_{BB}$ and/or $Q_{BB}$ from the baseband processor 240 to compensate for the estimated AM-AM distortion performance of the PA 214. The maximum output power level from the PA 214 may be determined by the asymptotic output signal power level curve 306. In the ideal PA response curve 304, the maximum output power level may be generated when the input power level is about 2 dBm. Based on the AM-AM distortion response curve 302, an output power level of about 26.5 dBm may be generated in response to an input power level of about 8 dBm. Thus, about 6 dB of digital distortion may be applied to the input signals $I_{BB}$ and/or $Q_{BB}$ from the baseband processor 240.

FIG. 3B is a graph illustrating an exemplary AM-PM distortion response in a transmitter power amplifier circuit, in accordance with an embodiment of the invention. Referring to FIG. 3B, there is shown an AM-PM distortion response curve 312, a minimum output phase curve 314, and a maximum output phase curve 316. In the exemplary graph shown in FIG. 3B, the horizontal axis represents input power levels, $p_{in}$, as described in FIG. 3A. The vertical axis represents output phase, $\phi_{out}$, as measured in degrees. The output phase may be derived based on a time delay between a time instant corresponding to generation of an input signal from the baseband processor 240, and a time instant corresponding to generation of a corresponding output signal from the PA 214.

In various embodiments of the invention, the AM-PM distortion response curve 312 may be derived by configuring the RF receiver 123a in calibration mode and generating input signals from the baseband processor 240 that span a range of input power levels. For each input signal generated at a specified input power level, an input time instant may be determined, and a corresponding time instant determined based on the time instant at which the corresponding feedback signal may be received at the baseband processor 240. The AM-PM distortion response curve 312 may comprise a characterization of the AM-PM distortion performance of the PA 214.

In the exemplary graph shown in FIG. 3B, the input power level may range from −8 dBm to 8 dBm, while the output phase may range from a minimum phase value of about 28° to a maximum phase value of about 38°. The minimum phase value may be represented by the minimum output phase curve 314, while the maximum phase value may be represented by the maximum output phase curve 316. The AM-PM distortion may be observed in the graph 312 when the output phase level changes in response to a change in the input power level.

In various embodiments of the invention, the baseband processor 240 may utilize the AM-PM distortion curve 312 to digitally predistort input signals generated by the baseband processor 240 by adjusting the relative phase $\phi_{in}$ of input signals $I_{BB}$ and $Q_{BB}$, such that the output phase $\phi_{out}$ is approximately constant for a range of input power levels. The constant output phase level may be referred to as a target output phase level.

In an exemplary embodiment of the invention, the baseband processor 240 may utilize the minimum phase curve 314 to determine that the target output phase level is to be about 28°. For an input power level of 0 dBm, the target output phase level may be 28°, however, due to the AM-PM distortion in the PA 214, the estimated output phase may be about 36° as shown in the AM-PM distortion response curve 312. The baseband processor 240 may utilize the minimum phase curve 314 to enable compensation for the estimated AM-PM distortion performance in the PA 214 by adjusting the relative phase $\phi_{in}$ of input signals $I_{BB}$ and $Q_{BB}$ by approximately 8° of AM-PM distortion in the PA 214.

In another exemplary embodiment of the invention, the baseband processor 240 may utilize the maximum phase curve 316 to determine that the target output phase level is to be about 38°. For an input power level of 0 dBm, the target output phase level may be 38°.

The baseband processor 240 may utilize the maximum phase curve 316 to enable compensation for the estimated AM-PM distortion performance in the PA 214 by adjusting the relative phase $\phi_{in}$ of input signals $I_{BB}$ and $Q_{BB}$ by approximately 2° of AM-PM distortion in the PA 214. Comparable time adjustments may be made for input signals generated for other input power levels based on the AM-PM distortion response curve 312, and a given target output phase level.

Various embodiments of the invention may be utilized to determine the target output phase level, which may not be restricted to a maximum and/or minimum value in the AM-PM distortion response curve 312.

In various embodiments of the invention, however, digital predistortion may be utilized to enable compensation of transmitter impairments in the PA 214 such that the PA 214 may be able to transmit signals at higher average output power levels while still complying with relevant EVM specifications, for example. In an exemplary case described above, digital predistortion may be utilized to enable an RF transmitter 123b to transmit signals at the saturation output power level by applying about 6 dB of digital predistortion to an input signal, for which the input power level may be about 2 dBm, to compensate for estimated AM-AM distortion in the PA 214.

Figure 4:
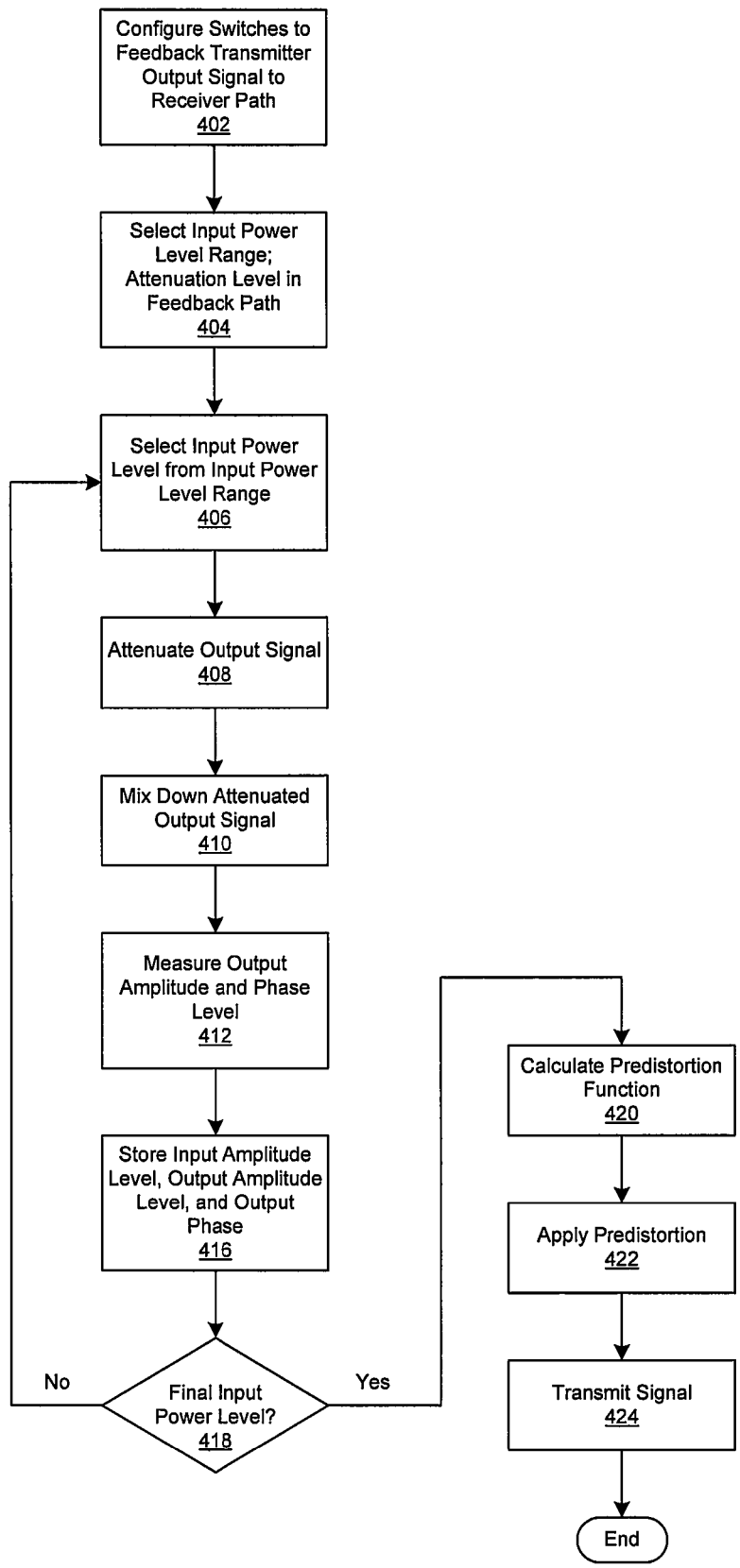
FIG. 4 is a flow chart illustrating an exemplary calibration method for estimating distortion in a transmitter, in accordance with an embodiment of the invention.

FIG. 4 is a flow chart illustrating an exemplary calibration method for estimating distortion in a transmitter, in accordance with an embodiment of the invention. FIG. 4 refers to a calibration method, which may be utilized to generate an AM-AM distortion response curve 302, and/or AM-PM distortion response curve 312. Referring to FIG. 4, in step 402, the baseband processor 240 may configure the I path selector switch 234a, and/or Q path selector switch 234b, to send a feedback signal to the baseband processor 240, which may be based on a PA 214 output signal that was generated in response to an input signal from the baseband processor 240. The feedback signal may be inserted in the RF receiver path 123a at an input to the I HPVGA 228a and/or Q HPVGA 228b.

In step 404, the baseband processor 240 may select a range of input power level values to be utilized during the calibration procedure. In addition, the baseband processor 240 may configure the signal attenuation block 218 to insert a specified level of signal attenuation in the signal received from the PA 214 before sending the attenuated signal to the feedback I mixer 220a and/or the feedback Q mixer 220b.

In step 406, the baseband processor 240 may select an input power level from the input power level range specified in step 404. The baseband processor 240 may generate an input signal that may be sent to the I DAC 202a and/or Q DAC 202b. The baseband processor may store information related to the input power level the input signals in addition to information related to the time instant at which the input signals were generated. In step 408, the signal attenuation block 218 may attenuate the signal received from the PA 214, utilizing a level of signal attenuation determined in step 404. In step 410, the feedback I mixer 220a and/or the feedback Q mixer 220b may downconvert the attenuated signal.

In step 412, the baseband processor 240 may measure the output power level at the PA 214 based on the received feedback signal. In step 416, the baseband processor 240 may store the input amplitude level, corresponding output amplitude level, and corresponding output phase level. In step 418, the baseband processor 240 may determine if there are additional input power levels to be selected to enable generation of the AM-AM distortion response curve 302 and/or AM-PM distortion response curve 312. If the current input power level is the last input power level in the input power level range selected in step 404, then in step 420 the predistortion function may be calculated by the baseband processor 240. In step 422, the predistortion function may be applied to baseband signals generated by the baseband processor 240. In step 424, an RF signal, generated in response to the predistorted baseband signal, may be transmitted by the RF transmitter 123b. If there are remaining input power levels in the input power level range at step 418, then a subsequent input power level may be selected in step 406.

Figure 5:
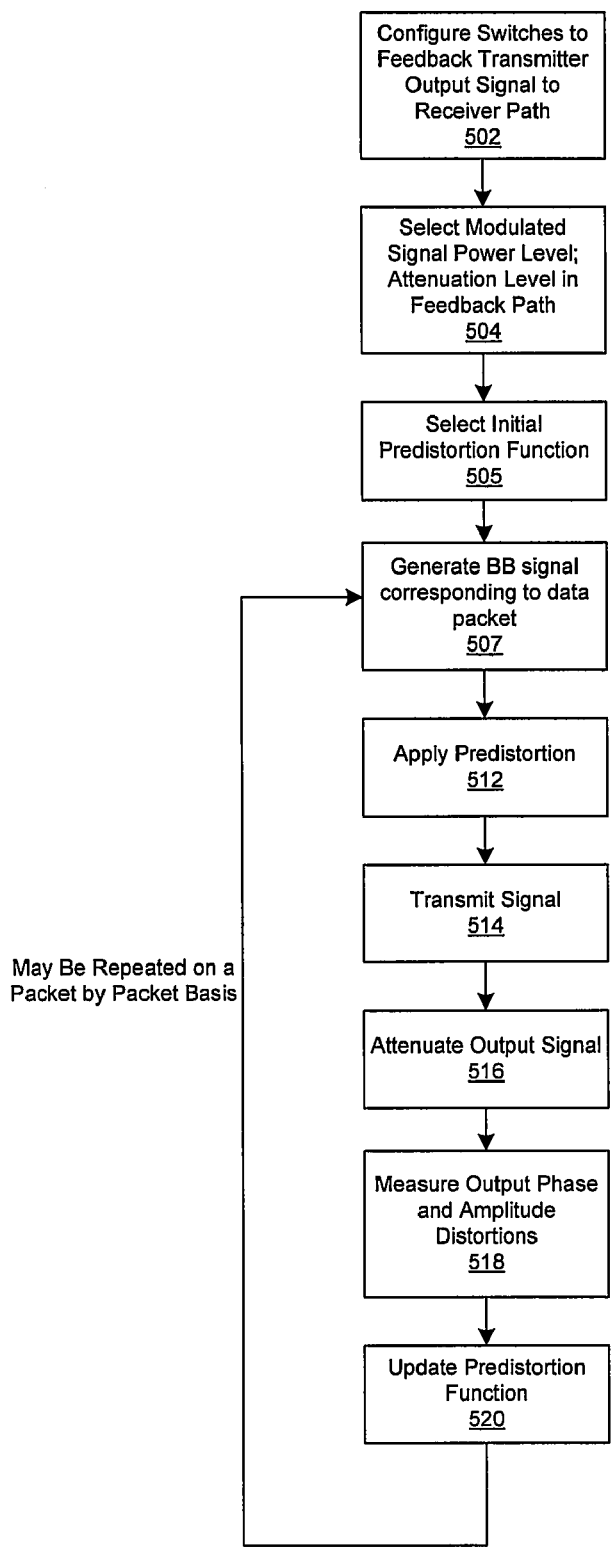
FIG. 5 is a flow chart illustrating an exemplary calibration method for estimating distortion in a transmitter for modulated data, in accordance with an embodiment of the invention.

FIG. 5 is a flow chart illustrating an exemplary calibration method for estimating distortion in a transmitter for modulated data, in accordance with an embodiment of the invention. FIG. 5 refers to a calibration method, which may be utilized to generate an AM-AM distortion response curve 302, and/or AM-PM distortion response curve 312 when utilizing modulated signals. Referring to FIG. 5, in step 502, the baseband processor 240 may configure the I path selector switch 234a, and/or Q path selector switch 234b, to send a feedback signal to the baseband processor 240, which may be based on a PA 214 output signal that was generated in response to an input signal from the baseband processor 240. The feedback signal may be inserted in the RF receiver path 123a at an input to the I HPVGA 228a and/or Q HPVGA 228b.

In step 504, the baseband processor 240 may select a modulated signal power level to be utilized for data transmission. An exemplary modulated signal is an OFDM signal. In addition, the baseband processor 240 may configure the signal attenuation block 218 to insert a specified level of signal attenuation in the signal received from the PA 214 before sending the attenuated signal to the feedback I mixer 220a, and/or feedback Q mixer 220b. In step 505, the baseband processor 240 may select an initial predistortion function. The initial predistortion function may be calculated using calibration method in FIG. 4. In step 507, the baseband processor 240 may generate the digital baseband signal corresponding to a data packet to be transmitted. In step 512, the predistortion function may be applied to baseband signals generated by the baseband processor 240. In step 514, an RF signal, generated in response to the predistorted baseband signal, may be transmitted by the RF transmitter 123b.

In step 516, the signal attenuation block 218 may attenuate the signal received from the PA 214, utilizing a level of signal attenuation determined in step 504. In step 518, the baseband processor 240 may measure the output phase and amplitude distortions in received feedback signals. In step 520, a predistortion function may be updated by the baseband processor 240. Steps 507-520 may be selectively repeated for one or more subsequently transmitted packets to recalibrate the RF transmitter 123b.

Aspects of a system for compensating for estimated distortion in a transmitter by utilizing a digital predistortion scheme with a quadrature feedback mixer configuration may include an RF transmitter 123b that enables generation of an RF output signal in response to one or more generated input signals. One or more feedback signals may be generated by performing frequency downconversion on the RF output signal within a corresponding one or more feedback mixer circuits 220a and 220b. The generated one or more feedback signals may be inserted at a corresponding one or more insertion points in an RF receiver path 123a or dedicated signal path. Each insertion point may be between a receiver mixer circuit 226a and 226b and corresponding circuits that generate baseband signals $I_{FB}$ and $Q_{FB}$ based on the corresponding one of the one or more feedback signals from the feedback mixer circuits 220a and 220b respectively.

The feedback mixer circuits 220a and 220b enable performance of frequency downconversion on an attenuated version of the generated RF output signal. The signal attenuation block 218 enables selection of an attenuation level for generation of the attenuated version of the generated RF output signal. The I path selector switch 234a and/or Q path selector switch 234b enables configuration of the RF receiver 123a for insertion of the generated one or more feedback signals. The input signals may comprise an in-phase (I) signal and a quadrature-phase (Q) signal.

The baseband processor 240 enables generation of a plurality of $I_{BB}$ and $Q_{BB}$ input signals and reception of a corresponding plurality of generated feedback signals $I_{FB}$ and $Q_{FB}$. The generated input signals may comprise a range of distinct input power levels. The baseband processor 240 may enable estimation of an output power level for the generated RF output signal from the PA circuit 214 based on the generated $I_{FB}$ and/or $Q_{FB}$ feedback signals for each corresponding distinct input power level. The baseband processor 240 may enable estimation of amplitude distortion in the generated RF output signal based on each estimated output power level.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for estimating distortion in a transmitter circuit in a wireless communications system, the method comprising:
in a single chip comprising a radio frequency (RF) transmitter and an RF receiver, generating an RF output signal at an output of one or more power amplifiers in said RF transmitter in response to a generated one or more input signals;
generating one or more feedback signals by performing a frequency downconversion operation on said generated RF output signal within a corresponding one or more feedback mixer circuits in said single chip; and
selectively inserting said generated one or more feedback signals at a corresponding one or more insertion points in said RF receiver utilizing one or more switches according to one of a normal operating mode and a calibration mode, wherein each of said corresponding one or more insertion points is between a corresponding mixer circuit in said RF receiver and a corresponding one or more circuits within said single chip that generate a baseband signal based on a corresponding one of said generated one or more feedback signals, and wherein said corresponding mixer circuit in said RF receiver is separate from said one or more feedback mixer circuits, and wherein selectively inserting according to said calibration mode comprises configuring a closed feedback loop comprising said RF transmitter and a portion of said RF receiver defined by said one or more insertion points.

2. The method according to claim 1, comprising performing said frequency downconversion operation on an attenuated version of said generated RF output signal.

3. The method according to claim 2, comprising selecting an attenuation level for generating said attenuated version of said generated RF output signal.

4. The method according to claim 1, comprising configuring said RF receiver for said insertion of each of said generated one or more feedback signals.

5. The method according to claim 1, wherein said one or more input signals comprises one or both of: an in-phase (I) signal and a quadrature-phase (Q) signal.

6. The method according to claim 1, comprising generating a plurality of said one or more input signals and receiving a corresponding plurality of one or more said generated baseband signal.

7. The method according to claim 6, wherein said each of said generated one or more input signals comprises a corresponding one or more distinct input power levels.

8. The method according to claim 7, comprising estimating an output power level for said generated RF output signal based on said generated one or more feedback signals for each said corresponding one or more distinct input power levels.

9. The method according to claim 8, comprising estimating amplitude distortion in said generated RF output signal based on said estimated output power level.

10. The method according to claim 7, comprising estimating phase distortion in said generated RF output signal based on said generated one or more feedback signals for each said corresponding one or more distinct input power levels.

11. The method according to claim 10, comprising estimating a phase adjustment for said generated one or more input signals based on said estimated phase distortion.

12. A system for estimating distortion in a transmitter circuit in a wireless communications system, the system comprising:
one or more circuits in a single chip comprising a radio frequency (RF) transmitter and a RF receiver, said one or more circuits are operable to generate an RF output signal at an output of one or more power amplifiers in said RF transmitter in response to a generated one or more input signals;
said one or more circuits are operable to generate one or more feedback signals by performing a frequency downconversion operation on said generated RF output signal within a corresponding one or more feedback mixer circuits in said single chip; and
said one or more circuits are operable to selectively insert said generated one or more feedback signals at a corresponding one or more insertion points in said RF receiver utilizing one or more switches according to one of a normal operating mode and a calibration mode, wherein each of said corresponding one or more insertion points is between a corresponding mixer circuit in said RF receiver and a corresponding one or more circuits within said single chip that generate a baseband signal based on a corresponding one of said generated one or more feedback signals, and wherein said corresponding mixer circuit in said RF receiver is separate from said one or more feedback mixer circuits.

13. The system according to claim 12, wherein said one or more circuits are operable to perform said frequency downconversion operation on an attenuated version of said generated RF output signal.

14. The system according to claim 13, wherein said one or more circuits are operable to select an attenuation level for generation of said attenuated version of said generated RF output signal.

15. The system according to claim 13, wherein said one or more circuits are operable to configure said RF receiver for said insertion of said generated one or more feedback signals.

16. The system according to claim 12, wherein said one or more input signals comprises one or both of: an in-phase (I) signal and a quadrature-phase (Q) signal.

17. The system according to claim 12, wherein said one or more circuits are operable to generate of a plurality of said one or more input signals and reception of a corresponding plurality of one or more said generated baseband signal.

18. The system according to claim 17, wherein said each of said generated one or more input signals comprises a corresponding one or more distinct input power levels.

19. The system according to claim 18, wherein said one or more circuits are operable to estimate an output power level for said generated RF output signal based on said generated one or more feedback signals for each said corresponding one or more distinct input power levels.

20. The system according to claim 19, wherein said one or more circuits are operable to estimate amplitude distortion in said generated RF output signal based on said estimated output power level.

21. The system according to claim 18, wherein said one or more circuits are operable to estimate phase distortion in said generated RF output signal based on said generated one or more feedback signals for each said corresponding one or more distinct input power levels.

22. The system according to claim 21, wherein said one or more circuits are operable to estimate a phase adjustment for said generated one or more input signals based on said estimated phase distortion.

23. A system for estimating distortion in a transmitter circuit in a wireless communications system, the system comprising:
one or more circuits in a single chip comprising a radio frequency (RF) transmitter, an RF receiver, and one or more power amplifiers, said one or more circuits enable generation of an RF output signal at an output of said one or more power amplifiers in said RF transmitter in response to a generated one or more input signals;
said one or more circuits enable generation of a plurality of feedback signals by performing a frequency downconversion operation on said generated RF output signal within a corresponding plurality of feedback mixer circuits in said single chip; and said one or more circuits enable selective insertion of said generated plurality of feedback signals as an input to said RF receiver utilizing one or more switches according to one of a normal operating mode and a calibretion mode.

24. A method for estimating distortion in a transmitter circuit in a wireless communications system, the method comprising:
in a single chip comprising a radio frequency (RF) transmitter and an RF receiver, generating an RF output signal at the output of one or more power amplifiers in said RF transmitter in response to a generated one or more input signals;
generating one or more feedback signals by performing a frequency downconversion operation on said generated RF output signal within a corresponding one or more feedback mixer circuits in said single chip;
selectively inserting said generated one or more feedback signals at a corresponding one or more insertion points in said RF receiver utilizing one or more switches according to one of a normal operating mode and a calibration mode; and
generating a baseband signal based on said generated one or more feedback signals.

25. A system for estimating distortion in a transmitter circuit in a wireless communications system, the system comprising:
one or more circuits in a single chip comprising a radio frequency (RF) transmitter and an RF receiver, said one or more circuits are operable to generate an RF output signal at the output of one or more power amplifiers in said RF transmitter in response to a generated one or more input signals;
said one or more circuits are operable to generate one or more feedback signals by performing a frequency downconversion operation on said generated RF output signal within a corresponding one or more feedback mixer circuits in said single chip;
said one or more circuits are operable to selectively insert said generated one or more feedback signals at a corresponding one or more insertion points in said RF receiver utilizing one or more switches according to one of a normal operating mode and a calibration mode; and
said RF receiver is operable to generate a baseband signal based on said generated one or more feedback signals, and
wherein during calibration mode, said one or more circuits for generating said baseband signal is further configured to compensate for at least one of AM-AM distortion and AM-PM distortion of said one or more power amplifiers.

26. The method according to claim 1, wherein said one or more circuits within said single chip that generate said baseband signal comprise a baseband processor.

27. The system according to claim 12, wherein said one or more circuits within said single chip that generate said baseband signal comprise a baseband processor.

28. The method according to claim 1, comprising configuring one or more switches in said RF receiver for said insertion of said generated one or more feedback signals.

29. The system according to claim 12, wherein said one or more circuits are operable to configure one or more switches in said RF receiver for said insertion of said generated one or more feedback signals.

* * * * *